United States Patent [19]
Mori et al.

[11] Patent Number: 5,367,486
[45] Date of Patent: Nov. 22, 1994

[54] SEMICONDUCTOR MEMORY DEVICE CAPABLE OF CORRECTLY AND SERIALLY READING STORED DATA SIGNALS

[75] Inventors: Junji Mori; Takayuki Miyamoto, both of Hyogo, Japan

[73] Assignee: Mitsubishi Denki Kabushiki Kaisha, Tokyo, Japan

[21] Appl. No.: 765,764

[22] Filed: Sep. 26, 1991

[30] Foreign Application Priority Data

Jan. 7, 1991 [JP] Japan .................................. 3-000237

[51] Int. Cl.$^5$ ............................................. G11C 13/00
[52] U.S. Cl. ................................ 365/189.05; 365/205; 365/221
[58] Field of Search ............. 365/189.05, 205, 221, 365/190, 154, 207, 208

[56] References Cited

U.S. PATENT DOCUMENTS

| | | | |
|---|---|---|---|
| 4,616,342 | 10/1986 | Miyamoto | 365/190 |
| 4,633,441 | 12/1986 | Ishimoto | 365/189 |
| 4,733,376 | 3/1988 | Ogawa | 365/221 |
| 4,931,995 | 6/1990 | Okasaka | 365/189.05 |
| 4,932,002 | 6/1990 | Houston | 365/205 |
| 5,018,109 | 5/1991 | Shinoda | 365/189.05 |
| 5,023,841 | 6/1991 | Akrout | 365/205 |
| 5,058,072 | 10/1991 | Kashimura | 365/205 |
| 5,138,578 | 8/1992 | Fujii | 365/205 |
| 5,172,340 | 12/1992 | Leforestier | 363/189.05 |

*Primary Examiner*—Eugene R. LaRoche
*Assistant Examiner*—A. Zarabian
*Attorney, Agent, or Firm*—Lowe, Price, LeBlanc & Becker

[57] ABSTRACT

In a serial memory, data signal holding circuits for temporarily holding data read from memory cells are provided as a data register. One holding circuit includes a latch circuit and capacitors connected to input/output nodes of the latch circuit, respectively. The capacitors contribute to stabilizing the latch function by the latch circuit. Therefore, when transistors turn on in response to a serial selection signal at a high level, the latch circuit is prevented from being inverted by the potentials of a serial bus line pair. Accordingly, generation of reading errors is prevented.

10 Claims, 6 Drawing Sheets

SEMICONDUCTOR MEMORY DEVICE CAPABLE OF CORRECTLY AND SERIALLY READING STORED DATA SIGNALS

BACKGROUND OF THE INVENTION

1. Field of the Invention

The present invention relates generally to semiconductor memory devices, and, particularly, to a semiconductor memory device capable of serially and correctly reading stored data signals. The present invention has particular applicability to a field memory.

2. Description of the Background Art

Recently, semiconductor memories have come to be employed in various equipment, and various functions of them have come to be demanded. Specifically, while a semiconductor memory basically has functions of storing applied (or predetermined) data and reading stored data, in addition, additional functions of accessing have become necessary. Particularly, serial accessing, i.e. serial reading and/or serial writing of data signals have become necessary for performing video signal or image signal processing at a high speed.

A field memory and a video RAM, for example, are known as random access memories (RAMs) having a serial access function. In a field memory, applied data signals are serially written in memory cells, and the stored data signals are read in the order in which they were written. One field memory has a memory capacity capable of storing digital picture element signals of one field of television, for example, so that it is often used as a delay circuit for video signal processing.

A video RAM has a random access port and a serial access port. A data signal applied through the random access port is stored in an externally designated memory cell, and the stored data signal is read from the externally designated memory cell. On the other hand, a data signal applied through the serial access port is serially stored in an externally designated memory cell row, and the stored data signal is serially read from the externally designated memory cell row. The random access port is often used for performing image signal processing at a high speed, while the serial access port is used for providing processed, i.e. stored image signals to an image display apparatus like a CRT at a high speed.

Furthermore, a first in first out (FIFO) memory for serially storing applied data signals and serially reading the stored data signals in the order in which they were stored is also known, although it is not a RAM.

It is pointed out that the semiconductor memories described above are common in that they have a function of serial accessing, particularly of serially reading a data signal stored in a memory cell. While the present invention is generally applicable to a semiconductor memory having a serial access function, only a field memory will be described in the following as an example for simplifying description.

Figure 2:
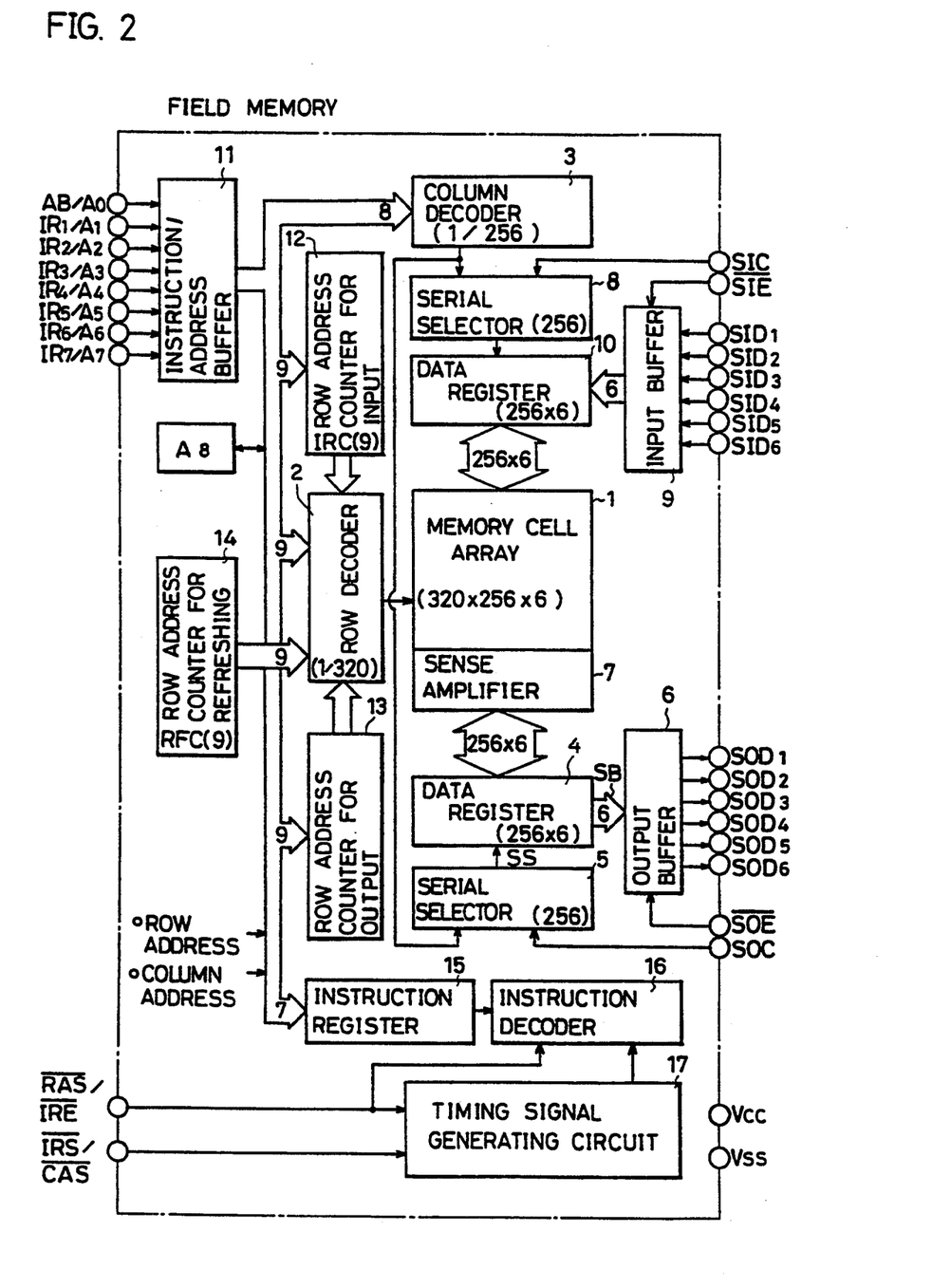
FIG. 2 is a block diagram of a field memory showing background of the present invention.

FIG. 2 is a block diagram of a field memory illustrating background of the present invention. Referring to FIG. 2, the field memory comprises a memory cell array 1 including multiple memory cells arranged in rows and columns, a row decoder 2 for selecting an externally designated memory cell row, a column decoder 3 for selecting an externally designated memory cell column, and a sense amplifier 7 for amplifying data signals read from the memory cell. A serial selector 8 for data input is connected to column decoder 3.

In a writing operation, an input buffer 9 receives externally applied serial input data SID1 to SID6 and applies received data to a data register 10. Data register 10 holds applied parallel data and applies held data to memory cell array 1 in response to an output signal generated from serial selector 8. Row decoder 2 selects one word line designated by an externally applied address signal, so that data applied from data register 10 is written in one memory cell row.

In a reading operation, row decoder 2 selects one word line designated by an externally applied address signal. Therefore, the data signal stored in a memory cell row connected to the selected word line is applied to a bit line (not shown) and amplified by sense amplifier 7. The parallel data signal amplified by sense amplifier 7 is applied to a data register 4 and held there. A serial selector 5 sequentially selects a latch circuit provided in data register 4 in response to an externally applied serial output clock signal SOC. Specifically, data register 4 sequentially supplies the held or the latched data signal as an output therefrom to a serial bus SB in response to a serial selection signal SS generated from serial selector 5. An output buffer 6 is connected to data register 4 through serial bus SB. Therefore, the data signal read from the memory cell row in memory cell array 1 is supplied, through output buffer 6, as serial output data SOD1 to SOD6.

Other circuits in the field memory will be simply described in the following. An instruction/address buffer 11 receives an externally applied instruction signal IR1 to IR7 and address signal A0 to A8. The received address signal A0 to A8 is applied to row decoder 2, column decoder 3, a row address counter for input 12, and a row address counter for output 13. Row decoder 2 selects a memory cell row, i.e. a word line in response to a count signal from address counter 12 or 13. In a refresh mode, row decoder 2 also selects a word line in response to a count signal from row address counter for refreshing 14. On the other hand, the instruction signal received by instruction/address buffer 11 is held in an instruction register 15. An instruction decoder 16 receives the instruction signal held in instruction register 15 and decodes it. Instruction decoder 16 generates various control signals for operation of the field memory in accordance with the externally applied instruction. The field memory comprises a timing signal generating circuit 17 generating a timing signal for making the above circuits operate in synchronism.

Figure 3:
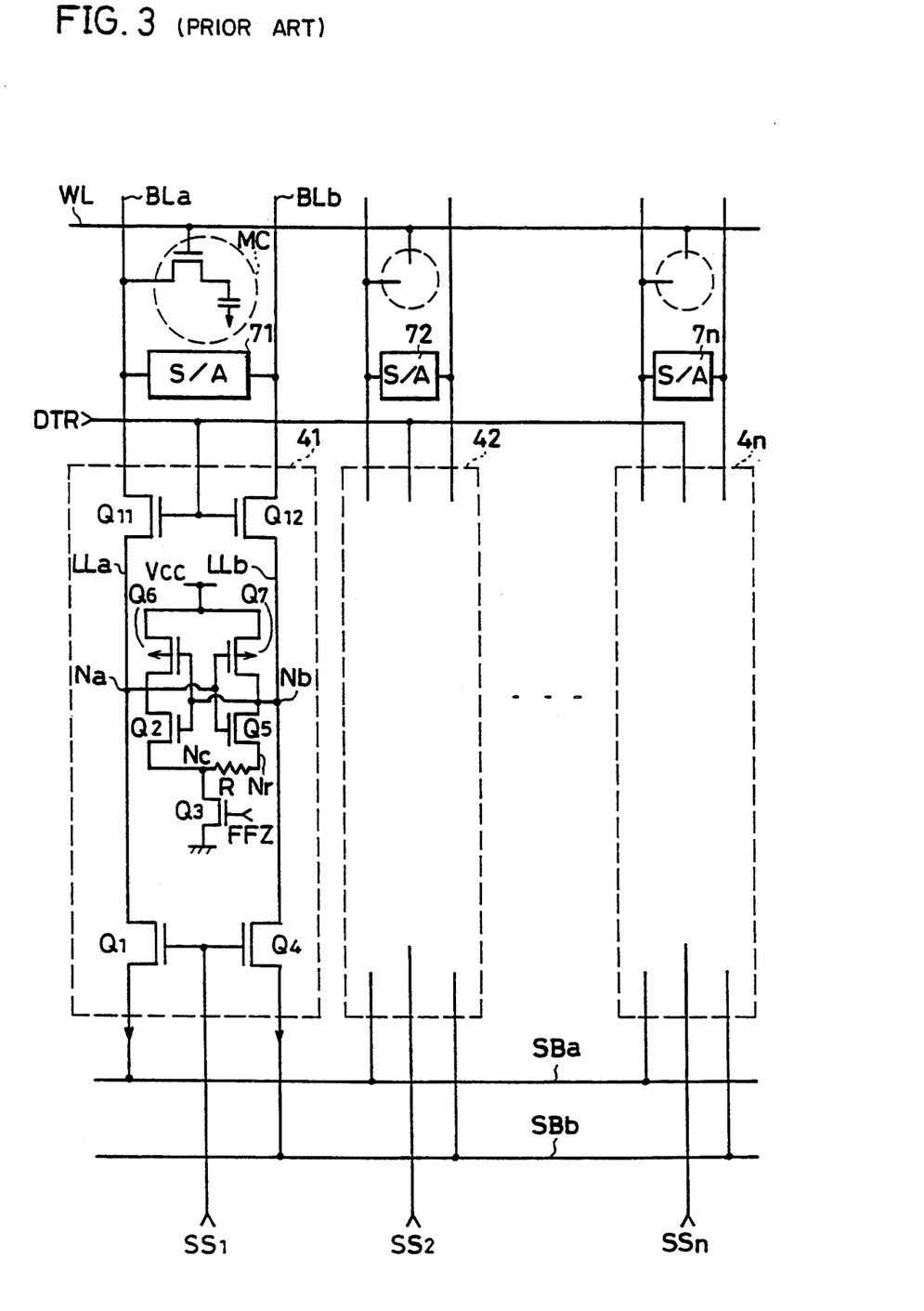
FIG. 3 is a circuit diagram of the data register shown in FIG. 2.

FIG. 3 is a circuit diagram of data register 4 shown in FIG. 2. Referring to FIG. 3, the data register circuit includes data signal holding circuits 41 to 4n connected to respective bit line pairs. Each of data signal holding circuits 41 to 4n is connected to a serial bus line pair. Since data signal holding circuits 41 to 4n have the same circuit configuration, only circuit 41 will be described in the following.

Data signal holding circuit 41 includes a latch circuit implemented with PMOS transistors Q6 and Q7 and NMOS transistors Q2 and Q5. An inverter is implemented with transistors Q6 and Q2, and another inverter is implemented with transistors Q7 and Q5. The two inverters are cross coupled and a latch circuit is implemented. The latch circuit has a first input/output node Na connected to a latch line LLa and a second input/output node Nb connected to a latch line LLb. A NMOS transistor Q3 for controlling activation of the latch circuit is connected between a common connection node Nc of transistors Q2 and Q5 and ground.

Transistor Q3 turns on in response to an activation signal FFZ applied from a control circuit not shown to activate the latch circuit.

The latch line pair LLa and LLb is connected, through NMOS transistors Q11 and Q12, to a bit line pair BLa and BLb. Transistors Q11 and Q12 have the gate connected to receive a data transmission signal DTR generated from the control circuit not shown. A memory cell MC includes a switching transistor and a capacitor for storing a data signal. When the level of a word line WL becomes high, the switching transistor turns on, and a small potential difference appears between bit lines BLa and BLb. A sense amplifier (S/A) 71 amplifies the small potential difference. When a data transmission signal DTR at a high level is applied, transistors Q11 and Q12 turn on, so that the amplified data signal is applied through latch lines LLa and LLb to the latch circuit and latched there.

Serial selector 5 shown in FIG. 2 generates a serial selection signal SS1 to SSn, which is a pulse signal sequentially rising. Transistors Q1 and Q4 turn on in a period during which signal SS1 attains the high level, so that the latched data signal, i.e. the data signal read from the memory cell MC is applied to serial bus line pair SBa and SBb. Serial selection signal SS1 to SSn is applied to respective data signal holding circuits 41 to 4n, so that the data signal latched in each latch circuit is sequentially applied to serial bus line pair SBa and SBb. The data signal applied to serial bus line pair SBa and SBb is supplied as an output through output buffer 6 shown in FIG. 2.

It is pointed out that a resistance R equivalently exists between the source of transistor Q5 and the drain of transistor Q3 in the latch circuit shown in FIG. 3. The reason why resistance R exists is as described in the following.

Figure 4:
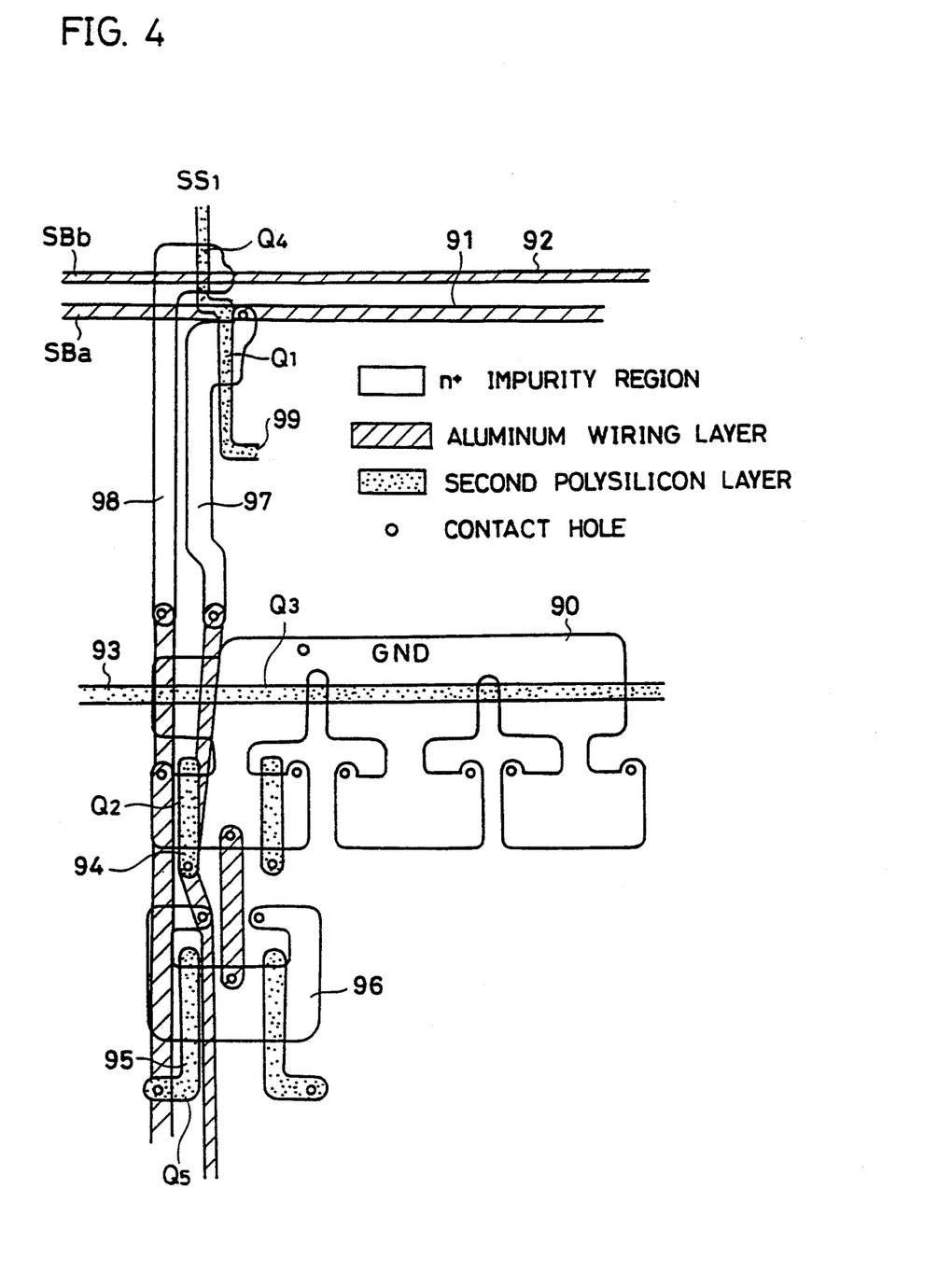
FIG. 4 is a layout of the latch circuit shown in FIG. 3 on a semiconductor substrate.

FIG. 4 is a layout diagram of the latch circuit shown in FIG. 3 on a semiconductor substrate. Referring to FIG. 4, serial bus lines SBa and SBb are formed out of aluminum wiring layers 91 and 92, respectively. A second polysilicon layer 99 formed on a n+ impurity region 97 with an insulating layer (not shown) interposed therebetween implements transistor Q1. Second polysilicon layer 99 is also formed on a n+ impurity region 98, so that transistor Q4 is implemented. The sources of transistors Q1 and Q4 are connected through contact holes to serial bus lines SBa and SBb, respectively. Second polysilicon layers 93 and 94 formed on a n+ impurity region 90, respectively, with the insulating layer interposed therebetween implement transistors Q3 and Q2, respectively. A second polysilicon layer 95 formed on a n+ impurity region 96 with the insulating layer interposed therebetween implements transistor Q5.

As seen from FIG. 4, transistor Q2 is formed in a position near n+ impurity region 90 grounded, while transistor Q5 is formed spaced more apart from it than transistor Q2 is. In addition, transistor Q5 is connected, through an aluminum wiring layer connected through a contact hole, to the drain of transistor Q3. Therefore, it is seen that the resistance value between the source of transistor Q5 and the drain of transistor Q3 is higher than the resistance value between the source of transistor Q2 and the drain of transistor Q3. As a result, as shown in FIG. 3 described above, it is seen that a resistance R equivalently exists between the source of transistor Q5 and the drain of transistor Q3. The existence of resistance R causes a problem as described in the following to be generated.

Figure 5:
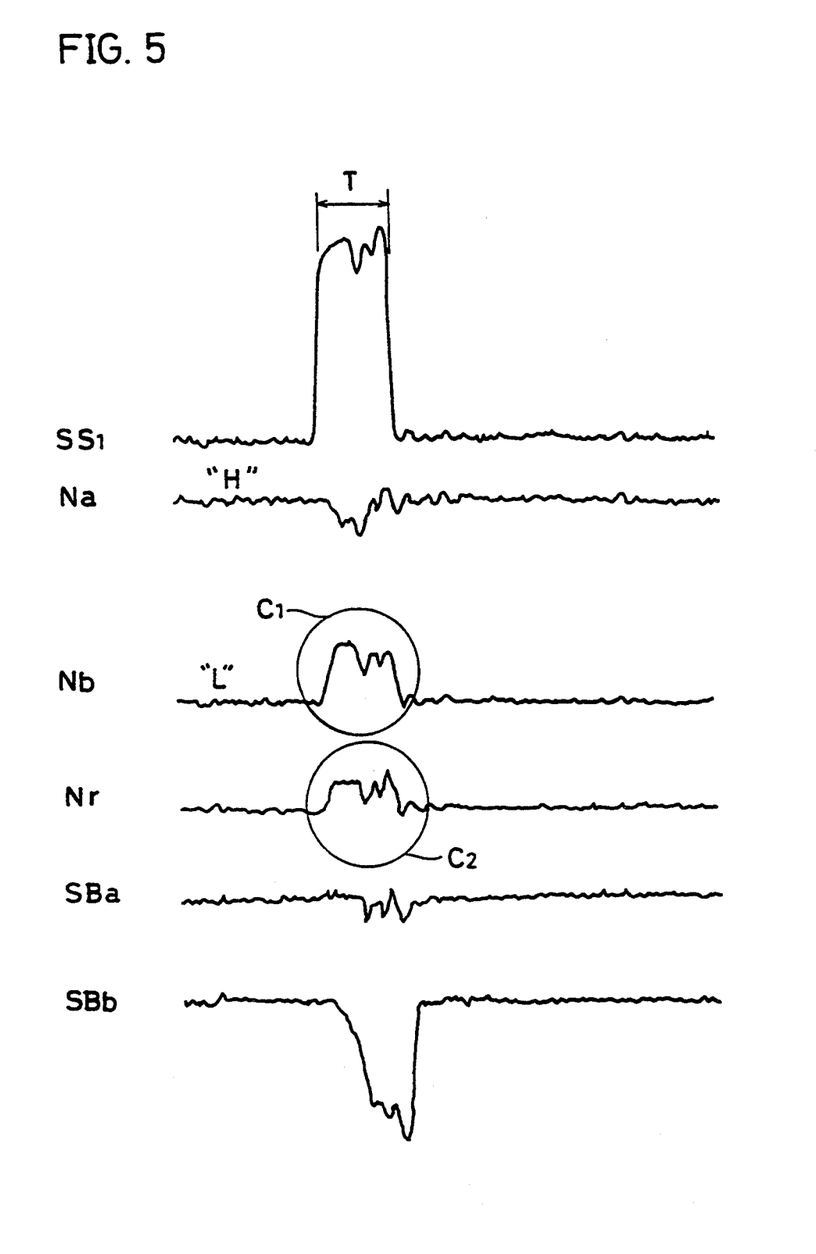
FIG. 5 is a signal waveform diagram for describing a normal operation of the data signal holding circuit shown in FIG. 3.

FIG. 5 is a signal waveform diagram for describing operation of data signal holding circuit 41 shown in FIG. 3. Referring to FIGS. 3 and 5, serial bus lines SBa and SBb are brought to a floating state of a high potential in advance. It is assumed that the latch circuit implemented with transistors Q2, Q5, Q6 and Q7 latches a data signal read from the memory cell MC, and potentials of nodes Na and Nb are at the high level and a low level, respectively. Serial selection signal SS1 attains the high level for a period T, so that transistors Q1 and Q4 turn on. Therefore, serial bus line SBb having a high potential is connected through transistor Q4 to node Nb. As a result, the high potential of serial bus line SBb is discharged through transistors Q4, Q5, resistance R, and transistor Q3. Accordingly, the current flows from serial bus line SBb to ground, so that the potential of a node Nr at the source of transistor Q5 is raised by the current as shown in a circle C2. As a result, the potential of input/output node Nb of the latch circuit temporarily rises as shown in a circle C1 in FIG. 5. In the case shown in FIG. 5, however, rise of the potential of node Nb is small, so that inversion of the latch circuit is prevented. On the other hand, in the case shown in FIG. 6, inversion of the latch circuit is caused as described in the following.

Figure 6:
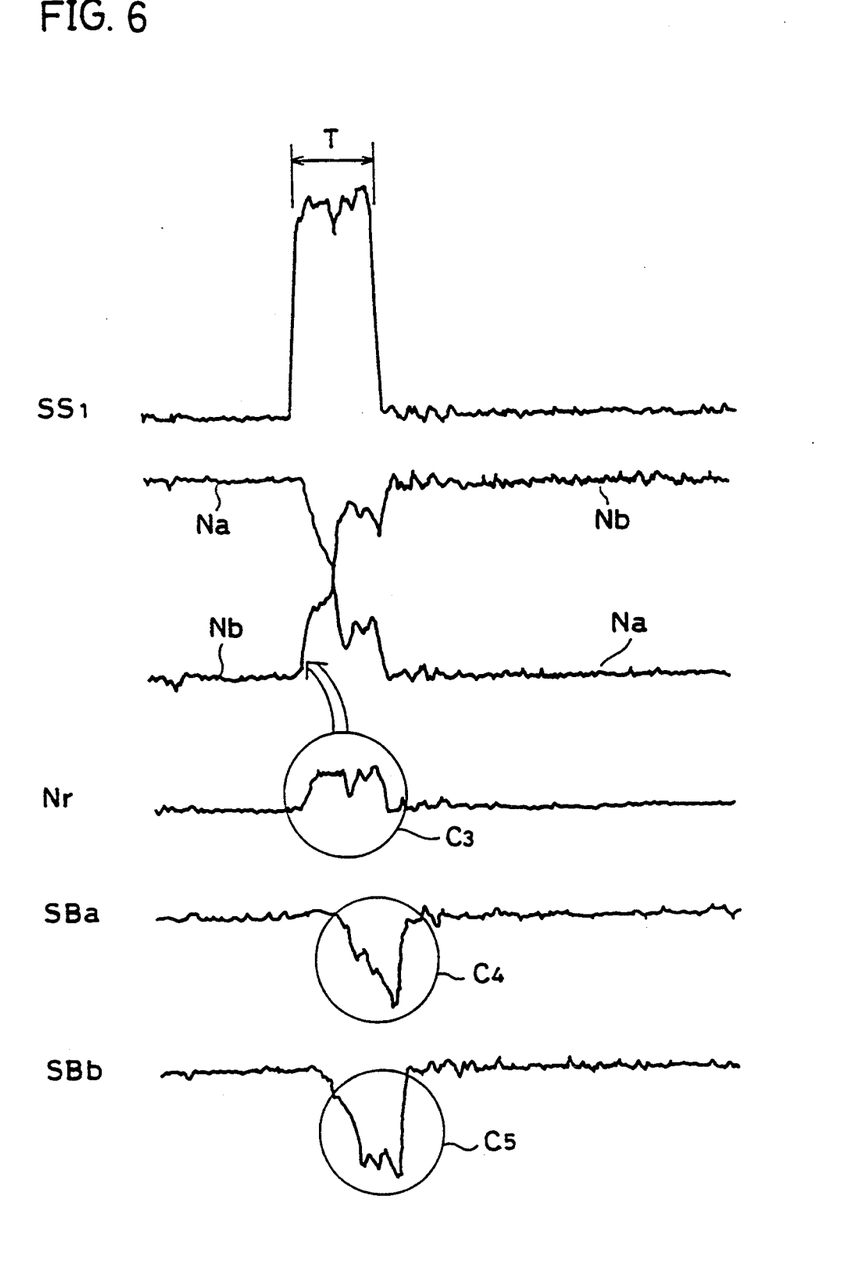
FIG. 6 is a signal waveform diagram for describing generation of a malfunction in the data signal holding circuit shown in FIG. 3.

Referring to FIG. 6, it is assumed that the value of resistance R shown in FIG. 3 is larger than that shown in FIG. 5. Therefore, as shown in a circle C3, the rise of the potential of node Nr at the source of transistor Q5 is larger than that in the case shown in FIG. 5. This causes a large rise of the potential of node Nb in the latch circuit, so that the latch circuit is inverted. According to the inversion of the latch circuit, the potentials supplied to serial bus lines SBa and SBb are also changed as shown in circles C4 and C5, so that false data signals are applied to serial bus line pair SBa and SBb. In other words, existence of resistance R causes read errors of the field memory to be generated.

SUMMARY OF THE INVENTION

One object of the present invention is to read correct data bit signals in a semiconductor memory device capable of serially reading stored data bit signals.

Another object of the present invention is to correctly read stored data bit signals in a serial memory device.

A semiconductor memory device according to the present invention comprises a memory cell train including a plurality of memory cells arranged in at least one direction, a plurality of data bit holding circuits holding data bit signals read from the plurality of memory cells, respectively, a serial bus line for serially transmitting the data bit signals held in the plurality of data bit holding circuits to the outside, a serial selector circuit serially selecting data bit signals to be provided as an output therefrom to the outside in response to an externally applied clock signal, a serial supply circuit serially supplying the data bit signals held in the plurality of data bit holding circuits to the serial bus line in response to the serial selector circuit, and a holding stabilizing circuit stabilizing a signal holding function by the plurality of data bit holding circuit.

In operation, the holding stabilizing circuit stabilizes the signal holding function by the plurality of data bit holding circuit, so that it is possible to prevent change in the held data bit signals which may be brought when the serial supply circuit supplies the held data bit signals to the serial bus line.

In an aspect, a semiconductor memory device according to the present invention comprises a memory cell train including a plurality of memory cells arranged in at least one direction, a plurality of bit lines connected to the plurality of memory cells, respectively, a plurality of latch circuits latching data bit signals applied from the plurality of memory cells to respective bit lines during the read operation, a serial bus line for serially transmitting data bit signals latched in the plurality of latch circuits to the outside, a serial selector circuit serially selecting a data bit signal to be read therefrom to the outside in response to an externally applied clock signal, a plurality of switching transistors sequentially turning on between the plurality of latch circuits and the serial bus line in response to the serial selector circuit, and a plurality of capacitors connected to a plurality of connection nodes connecting the plurality of latch circuits and the plurality of switching transistors, respectively.

In operation, while there is a tendency that the plurality of latch circuits have the latched signals changed with the potential on the serial bus line in response to the ON state of the plurality of switching transistors, the plurality of capacitors prevent the latched signals from being changed. Accordingly, correct data bit signals are read.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
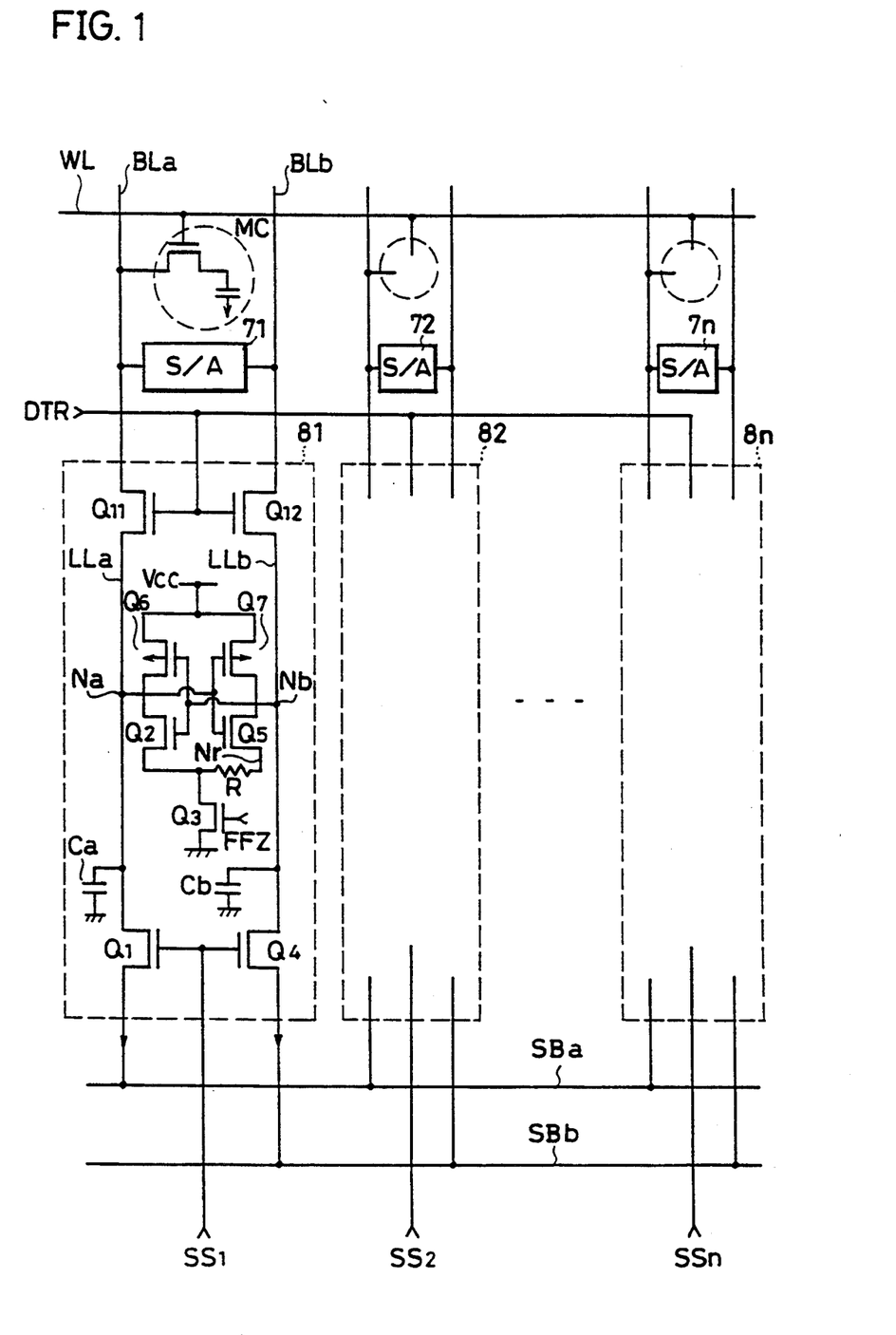
FIG. 1 is a circuit diagram of an improved data register showing one embodiment of the present invention.

Referring to FIG. 1, in comparison with the conventional circuit shown in FIG. 3, the improvement is that each of data signal holding circuits 81 to 8n has capacitors Ca and Cb connected to latch lines LLa and LLb, respectively. Capacitor Ca is connected between latch line LLa and ground. Capacitor Cb is connected between latch line LLb and ground. Capacitors Ca and Cb contribute to stabilizing a latching action by a latch circuit implemented with transistors Q2, Q5, Q6, and Q7. Specifically, capacitors Ca and Cb are charged or discharged by the potentials of nodes Na and Nb, respectively. For example, when the potential of node Na attains the high level, capacitor Ca is charged, while the potential of node Nb attains the low level, so that capacitor Cb is discharged. Accordingly, when transistors Q1 and Q4 turn on in response to a serial selection signal SS1 at the high level, the charge of a high potential on a serial bus line SBb is absorbed by capacitor Cb. In other words, current does not flow from serial bus line SBb, through transistors Q4, Q5, a resistance R, and a transistor Q3, to ground, so that the potential of a node Nr at the source of transistor Q5 is prevented from rising. Accordingly, the potential of node Nb does not rise, so that the latch circuit is prevented from being inverted.

Now, the capacitance value of capacitors Ca and Cb will be described. Capacitors Ca and Cb contribute to stabilizing the latch action by the latch circuit as described above. The capacitance value of each of capacitors Ca and Cb is, preferably, set to a value approximately the same as the value of stray capacitance which each of serial bus lines SBa and SBb has with respect to ground. According as the capacitance values of capacitors Ca and Cb are set larger, the latch action is more stabilized, while the time required for inverting the latched data signals increases. This means that the reading speed of the serial memory is reduced. Accordingly, the allowable largest value of capacitors Ca and Cb is determined in consideration of the operation speed required in the serial memory and inversion driving capability of the latch circuit.

As described above, in each of data signal holding circuits 81 to 8n in the serial register, capacitors Ca and Cb are connected to latch lines LLa and LLb, respectively, so that the latch action by the latch circuit is stabilized. In other words, when transistors Q1 and Q4 turn on in response to serial selection signal SS1 attaining the high level, the latch circuit is prevented from being mistakenly inverted. As a result, a correct data signal is applied through transistors Q1 and Q4 to serial bus line pair SBa and SBb, so that generation of reading errors is prevented.

Although a case where the present invention is applied in a field memory has been described as an example in the above description, it is also possible to apply the present invention to the other semiconductor memories capable of serial accessing, i.e. a video RAM and a FIFO memory, as described above. In other words, it is pointed out that, in general, the present invention is largely applicable to a semiconductor memory having a data register for serially reading stored data signals, i.e. a latch circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 a memory cell train including a plurality of memory cells arranged in at least one direction;
 a plurality of data bit holding means coupled to said memory cell train for holding data bit signals read from said plurality of memory cells, respectively;
 a serial bus line for serially transmitting the data bit signals held in said plurality of data bit holding means to the outside;
 serial selector means responsive to an externally applied clock signal for serially selecting the data bit signals to be provided therefrom to the outside;
 serial supply means responsive to said serial selector means for serially supplying the data bit signals held in said plurality of data bit holding means to said serial bus line;

holding stabilizing means connected to said plurality of data bit holding means for stabilizing a signal holding function by said plurality of data bit holding means; and a plurality of sense amplifiers connected to said plurality of memory cells for sensing data from a memory cell and amplifying small voltage differences between pairs of bit lines;

said plurality of data bit holding means receiving the data bit signals from said plurality of sense amplifiers and holding the data bit signals as potential levels of predetermined nodes therein;

said serial supply means connected between said predetermined nodes and said serial bus line for separating and connecting said predetermined nodes from and to said serial bus line in accordance with said serial selector means; and said holding stabilizing means connected to said predetermined nodes.

2. The semiconductor memory device according to claim 1, wherein said serial supply means includes a plurality of switching means responsive to said serial selection means for sequentially connecting between said plurality of data bit holding means and said serial bus line;

each of said plurality of data bit holding means has a tendency to change the held data bit signals in response to the ON state of corresponding one of said switching means; and said holding stabilizing means includes a plurality of change prevention means connected to said plurality of data bit holding means, respectively, for preventing change in the data bit signals held in respective data bit holding means.

3. The semiconductor memory device according to claim 2 further comprising a plurality of bit lines connected to each of said plurality of memory cells for transmitting the data bit signals stored in respective memory cells, wherein said plurality of data bit holding means include a plurality of latch circuit means coupled to said plurality of bit lines, respectively.

4. The semiconductor memory device according to claim 3, wherein said plurality of change prevention means includes a plurality of capacitance means connected to said respective latch circuit means; and each of said capacitance means has a capacitance value determined by an operation speed required in said semiconductor memory device and a capability of said respective latch circuit means to be inverted by discharge of said serial bus line therethrough.

5. The semiconductor memory device according to claims 4, wherein each of said latch circuit means includes two inverter means coupled to said plurality of bit lines, respectively, and cross coupled to each other; and each of said capacitance means has a capacitance value determined by an operation speed required in said semiconductor memory device and a capability of said respective latch circuit means to be inverted by discharge of said serial bus line therethrough.

6. The semiconductor memory device according to claim 1, wherein said semiconductor memory device includes a field memory device.

7. A semiconductor memory device capable of serially reading stored data bit signals comprising:

a memory cell train including a plurality of memory cells arranged in at least one direction;

a plurality of bit lines connected to said plurality of memory cells, respectively;

a plurality of latch circuits connected to said plurality of bit lines, respectively, for latching data a bit signals applied from said plurality of memory cells to respective bit lines during read operation;

a serial bus line for serially transmitting the data bit signals latched in said plurality of latch circuits to the outside;

a serial selector circuit responsive to an externally applied clock signal for serially selecting data bit signals to be read therefrom to the outside;

a plurality of switching transistors connected between said plurality of latch circuits and said serial bus line, responsively, to an output signal generated from said serial selector circuit for sequentially turning on;

said plurality of latch circuits having a tendency to change a latched signal with a potential on said serial bus line in response to the ON state of said plurality of switching transistors; and a plurality of capacitors connected to a plurality of connection nodes connecting said plurality of latch circuits and said plurality of switching transistor, respectively;

said plurality of capacitors preventing the signals latched in said plurality of latch circuits from being changed by the ON state of said plurality of switching transistors.

8. The semiconductor memory device according to claim 7, wherein said semiconductor memory device comprises a field memory device.

9. A semiconductor memory device in accordance with claim 7, further comprising:

a plurality of sense amplifiers connected to said plurality of memory cells for sensing data from a memory cell and amplifying small voltage differences between pairs of bit lines;

said plurality of latch circuits receiving the data bit signals from said plurality of sense amplifiers and latching the data bit signals as potential levels of said plurality of connection nodes therein;

said plurality of switching transistors connected between said connection nodes and said serial bus line for separating and connecting said connection nodes from and to said serial bus line in accordance with said serial selector circuit; and said plurality of capacitors connected to said connection nodes for discharging said serial bus line upon activation of said switching transistors thereby preventing change of the latched signal stored in said latch circuit by discharge of said serial bus line through said latch circuit.

10. A semiconductor memory device capable of serially reading stored data bit signals comprising:

a memory cell train including a plurality of memory cells arranged in at least one direction;

a plurality of bit lines connected to said plurality of memory cells, respectively;

a plurality of latch circuits connected to said plurality of bit lines, respectively, for latching data bit signals applied from said plurality of memory cells to respective bit lines during read operation;

a serial bus line for serially transmitting the data bit signals latched in said plurality of latch circuits to the outside;

a serial selector circuit responsive to an externally applied clock signal for serially selecting the data bit signals to be read therefrom to the outside;

a plurality of switching transistors connected between said plurality of latch circuits and said serial bus line, responsively, to an output signal generated from said serial selector circuit for sequentially turning on;

said plurality of latch circuits having a tendency to change a latched signal with a potential on said serial bus line in response to the ON state of said plurality of switching transistors; and a plurality of capacitor means connected to a plurality of connection nodes connecting said plurality of latch circuits and said plurality of switching transistors for preventing change of a particular latched signal stored in a particular one of said plurality of latch circuits in response to discharge of said serial bus line through said particular latch circuit upon activation of said switching transistors.

* * * * *